US 9,404,974 B2

(12) United States Patent
Sato et al.

(10) Patent No.: US 9,404,974 B2
(45) Date of Patent: Aug. 2, 2016

(54) MOTOR DRIVE DEVICE INCLUDING INSULATION DETERIORATION DETECTION FUNCTION AND INSULATION RESISTANCE DETECTION METHOD OF MOTOR

(71) Applicant: FANUC Corporation, Yamanashi (JP)

(72) Inventors: Hiroyasu Sato, Yamanashi (JP); Masaya Tateda, Yamanashi (JP); Akira Hirai, Yamanashi (JP)

(73) Assignee: FANUC CORPORATION, Yamanashi (JP)

( * ) Notice: Subject to any disclaimer, the term of this patent is extended or adjusted under 35 U.S.C. 154(b) by 0 days.

(21) Appl. No.: 14/591,500

(22) Filed: Jan. 7, 2015

(65) Prior Publication Data

US 2015/0194922 A1   Jul. 9, 2015

(30) Foreign Application Priority Data

Jan. 8, 2014   (JP) ................................ 2014-001812

(51) Int. Cl.
| H02P 25/00 | (2006.01) |
| H02H 7/08 | (2006.01) |
| G01R 31/34 | (2006.01) |
| G01R 27/02 | (2006.01) |
| G01R 31/14 | (2006.01) |

(52) U.S. Cl.
CPC ............ *G01R 31/346* (2013.01); *G01R 27/025* (2013.01); *G01R 31/14* (2013.01)

(58) Field of Classification Search
CPC .................................. H02P 27/06; H02H 3/00
USPC ....................................................... 318/504
See application file for complete search history.

(56) References Cited

U.S. PATENT DOCUMENTS

| 2006/0022679 A1* | 2/2006 | Obata .................... G01R 31/06 324/551 |
| 2008/0094022 A1* | 4/2008 | Horikoshi ............... H02P 29/00 318/802 |
| 2008/0150549 A1* | 6/2008 | Horikoshi ............ G01R 31/343 324/557 |
| 2010/0171511 A1* | 7/2010 | Horikoshi .......... G01R 31/1263 324/551 |
| 2011/0080676 A1* | 4/2011 | Yoshida ............... G01R 31/025 361/30 |

FOREIGN PATENT DOCUMENTS

| JP | 3-84475 A | 4/1991 |
| JP | 9-152453 A | 6/1997 |
| JP | 2000-258509 A | 9/2000 |
| JP | 2003-66074 A | 3/2003 |
| JP | 2006-220520 A | 8/2006 |
| JP | 4554501 B2 | 8/2006 |
| JP | 2008-58088 A | 3/2008 |
| JP | 4565036 B | 7/2010 |

* cited by examiner

*Primary Examiner* — Eduardo Colon Santana
*Assistant Examiner* — Gabriel Agared
(74) *Attorney, Agent, or Firm* — Hauptman Ham, LLP

(57) ABSTRACT

A motor drive device of the present invention includes: a rectification circuit configured to rectify an AC voltage; a power source unit configured to smooth a DC voltage by a capacitor; an inverter unit configured to drive a motor by converting a DC voltage into an AC voltage; a current detection unit configured to measure a current flowing through a resistor which is connected to a coil of the motor and the capacitor; a voltage detection unit configured to measure a value of a voltage across the capacitor; a second switch that grounds the capacitor; and an insulation resistance detection unit configured to detect an insulation resistance value of a motor by using two sets of a current value and a voltage value measured in two states where the second switch is turned off and turned on.

4 Claims, 7 Drawing Sheets

US 9,404,974 B2

MOTOR DRIVE DEVICE INCLUDING INSULATION DETERIORATION DETECTION FUNCTION AND INSULATION RESISTANCE DETECTION METHOD OF MOTOR

CROSS-REFERENCE TO RELATED APPLICATIONS

This application is a new U.S. patent application that claims benefit of JP 2014-001812, filed on Jan. 8, 2014, the entire content of JP 2014-001812 is hereby incorporated by reference.

FIELD OF THE INVENTION

The present invention relates to a motor drive device and an insulation resistance detection method of a motor, and in particular, to a motor drive device including an exact motor insulation resistance measurement function that has removed the influence of a leakage current flowing through a semiconductor switching element of an inverter and an insulation deterioration detection function, and an insulation resistance detection method of a motor.

BACKGROUND OF THE INVENTION

Conventionally, a motor drive device including a function for detecting insulation deterioration of a motor winding (coil) by applying a voltage charged across a smoothing capacitor of a DC link unit between the motor winding and the ground is known (e.g., Japanese Patent Publication No. JP-B-4554501). In a conventional motor drive device, insulation deterioration of a motor is detected by measuring a leakage current flowing between a motor coil and the ground by applying a voltage charged across a smoothing capacitor of a direct-current power source (DC link unit) connected to an inverter between the motor coil and the ground after shutting off an alternating-current power source by a switch.

Further, a motor drive device including a plurality of inverter units for driving a plurality of motors is known, which calculates an insulation resistance of each motor by detecting voltages and currents at a time at the same timing by using one voltage detection unit of a common converter unit and a plurality of current detection units of each inverter unit for each motor (e.g., Japanese Patent Publication No. JP-B-4565036. Hereinafter, referred to as "Patent Literature 2").

Each of the above-mentioned conventional techniques makes use of a high voltage charged across a smoothing capacitor originally included in the inverter as a power source for measurement. Therefore, it is not necessary to separately provide a dedicated power source for measurement, and therefore, the configuration is simple and each technique is an excellent method in that measurement results with a high accuracy are obtained because a high measurement voltage is obtained.

In order to measure a high insulation resistance value with a high accuracy, it is advantageous to increase a measurement current value by increasing a voltage that is applied. This is obvious from the fact that many measuring instruments for measuring an insulation resistance, which is called an insulation resistance meter or a megohm tester, set high measurement voltages, such as 250 [V], 500 [V], and 1,000 [V].

FIG. 1 illustrates an example of a configuration of a motor drive device that uses the conventional technique disclosed in Patent Literature 2.

The measurement procedure of the insulation resistance of a motor that makes use of a conventional motor drive device 1000 is as follows. First, an alternating-current power source 1002 is disconnected from a rectification circuit 1003 by turning off a first switch 1001 in a state where all semiconductor switching elements 1051 to 1056 of an inverter 1005 including the semiconductor switching elements 1051 to 1056 and diodes 1051d to 1056d connected in inversely parallel thereto are turned off. Next, a second switch 1009 and a third switch 1010 are turned on and a plus side terminal 1042 of a smoothing capacitor 1041 of a DC link unit 1004 is connected to the ground. As a result of that, a charged voltage of the capacitor 1041 of the DC link unit 1004 is applied between coils 1061 to 1063 of a motor 1006 and the ground. At this time, a current flowing through a closed circuit indicated by a dotted line (see FIG. 1) formed by the capacitor 1041, the motor coil (e.g., 1062), and the ground is measured by a current measurement circuit 1007 provided between the motor coil 1062 and a minus side terminal 1043 of the capacitor 1041 of the DC link unit 1004. At the same time as this, a voltage between terminals of the capacitor 1041 of the DC link unit 1004 at this time is also measured by a voltage measurement circuit 1008 connected in parallel to the DC link unit 1004 by using a detection resistor 1081 and a voltage division resistor 1082. Then, the insulation resistance value between the motor 1006 and the ground is found from the voltage value and the current value obtained by the above measurement.

FIG. 2 illustrates an equivalent circuit representing the relationship of connection between the closed circuit and the semiconductor switching element at the time of measurement of the insulation resistance in the configuration in FIG. 1 in relation to the conventional motor drive device. At the time of measurement, the first switch 1001 is in the OFF state, and therefore, the alternating-current power source 1002 is disconnected. Further, the second switch 1009 and the third switch 1010 are in the ON state, and therefore, the plus side terminal 1042 of the DC link unit 1004 is connected to the ground and the current measurement circuit 1007 is connected to the minus side terminal 1043 of the DC link unit 1004. "$RU_{\_IGBT}$" represents an equivalent insulation resistance value when the semiconductor switching elements 1051, 1053, and 1055 of an upper arm of the inverter are OFF, "$RD_{\_IGBT}$" represents an equivalent insulation resistance value when the semiconductor switching elements 1052, 1054, and 1056 of a lower arm of the inverter are OFF, "Rm" represents an insulation resistance value between the coil of the motor to be measured and the ground, and "RC" represents a resistance value when the serial connection of a voltage division resistor 1072 and a current detection resistor 1071 of the current measurement circuit 1007 is represented by one resistor, respectively.

In the conventional technique, due to high voltage charged across the smoothing capacitor 1041 a leakage current that flows through the semiconductor switching elements 1051 to 1056 in the OFF state of the inverter 1005 occurs and these currents overlap the measurement current, and therefore, there has been a problem that the measurement accuracy is reduced at high temperatures particularly when the leakage current flowing through the semiconductor switching elements increases.

In the above description, the "leakage current flowing through the semiconductor switching elements in the OFF state" refers to, in the example of an IGBT, a leakage current that flows from the collector to emitter in the state where the IGBT is OFF.

The leakage current in the OFF state is specified as the electrical characteristics represented by a symbol $I_{CES}$ in the IGBT and is called a "collector-emitter leakage current". The collector-emitter leakage current ($I_{CES}$) is specified as a leakage current that flows from the collector to emitter when a specified voltage (usually, a maximum rated voltage) is applied between the collector and emitter in the state where the gate and emitter are short-circuited, i.e., in the state where the IGBT is perfectly turned off.

The collector-emitter leakage current ($I_{CES}$) of the IGBT has strong temperature dependence and the leakage current $I_{CES}$ has the characteristics that the leakage current $I_{CES}$ increases exponentially when temperature rises.

Further, it is known that such characteristics that the leakage current in the OFF state increases as temperature rises are observed not only in the IGBT but also in other semiconductor switching elements, such as MOS-FET. For example, in the case of the MOS-FET, the characteristics are specified as the electrical characteristics represented by a symbol $I_{DSS}$ as the drain-source leakage current in the OFF state.

In general, an increase in the leakage current $I_{CES}$ at high temperatures in the IGBT for the use as an inverter for driving a motor is regarded as a problem mainly from a viewpoint of an increase in loss. However, even if the leakage current $I_{CES}$ is on the order of several ten [µA], which does not result in any problem from the viewpoint of a loss in a motor drive device, the leakage current $I_{CES}$ will cause a reduction in the measurement accuracy in the insulation resistance measurement of a motor in the conventional technique.

Specifically, as is obvious from FIG. 2, the problematic point of the conventional technique is that part of the leakage current flowing through the semiconductor switching elements 1051 to 1056 in the OFF state overlaps the current (see a current I indicated by a dotted line arrow in FIG. 2), which is the original target of measurement, flowing through the insulation resistor Rm between the motor 1006 and the ground (see FIG. 1), and flows directly into the current measurement circuit 1007 (see $I_{LEAK}$ indicated by an alternate long and short dash line in FIG. 2), and therefore, the leakage current flowing through the semiconductor switching elements 1051 to 1056 directly causes a measurement error.

In the conventional technique also, if the current flowing through the semiconductor switching elements 1051 to 1056 is so sufficiently small that it can be ignored compared to the measurement current, it is unlikely that the measurement accuracy of the insulation resistance measurement of the motor 1006 reduces to bring about a practical problem.

A criterion to determine whether or not the equivalent insulation resistance value of the semiconductor switching elements 1051 to 1056 in the OFF state affects the measurement accuracy of the insulation resistance measurement of the motor can be considered as follows. If the equivalent insulation resistance value of the semiconductor switching elements 1051 to 1056 in the OFF state is sufficiently large compared to the insulation resistance value of the motor 1006 to be measured, it can be considered that no problematic influence will occur. However, in the case where the equivalent insulation resistance value of the semiconductor switching elements 1051 to 1056 is equal to or less than the insulation resistance value of the motor 1006 to be measured, it will be difficult to perform insulation resistance measurement with substantially high accuracy. This is also obvious from the equivalent circuit in FIG. 2.

FIG. 3 is a graph indicating the relationship (temperature dependence) between the collector-emitter leakage current $I_{CES}$ [µA], which is the leakage current when the IGBT having a typical withstand voltage of 1,200 [V], used in an industrial inverter, and a junction temperature $T_j$ [° C.].

FIG. 3 is a graph obtained by measuring the leakage current in a parallel connection in which the three collectors and the three emitters of the upper arm of the IGBT are connected by supposing a case where the IGBT is used in a three-phase inverter. The graph obtained by measurement by similarly parallelly connecting the three collectors and the three emitters of the lower arm of the IGBT perfectly agree with the graph of the upper arm, and therefore, in FIG. 3, only one graph is illustrated.

A value obtained by dividing a voltage of 1,200 [V] applied between the collector and emitter at the time of measurement by the leakage current $I_{CES}$ [µA] that flows from the collector to emitter, which is read from the graph in FIG. 3, is the equivalent insulation resistance value between the collector and emitter at each temperature of the IGBT. Based on the graph in FIG. 3, to which extent the leakage current of the IGBT affects the insulation resistance measurement of the conventional technique at each temperature is explained below.

At room temperature (25 [° C.], the leakage current when the IGBT is OFF is as small as about 0.3 [µA] and this corresponds to about 4 [GΩ] in terms of the equivalent insulation resistance value of the IGBT. This value is a sufficiently large value compared to the insulation resistance value (100 [MΩ] to 1 [MΩ]) of the motor to be measured, and therefore, it can be considered that the leakage current of the IGBT does not considerably affect the measurement accuracy of the insulation resistance of the motor at room temperature.

However, as the temperature of the IGBT rises, the leakage current of the IGBT increases exponentially. In the case where the conjunction temperature T is 80 [° C.], the leakage current of the IGBT is about 40 [µA] and this means that in terms of the equivalent insulation resistance value of the IGBT, the value reduces to about 30 [MΩ]. In this case, it can be concluded that the equivalent insulation resistance reduces to a level that affects the measurement accuracy due to the leakage current of the IGBT when measuring the insulation resistance value of the motor by the conventional technique.

Further, when the conjunction temperature $T_j$ rises up to 100 [° C.], the leakage current when the IGBT is OFF increases to about 200 [µA] and in terms of the equivalent insulation resistance value of the IGBT, the value is about 6 [MΩ]. In this case, the equivalent insulation resistance value reduces to a resistance value equal to or less than the insulation resistance value of the motor to be measured, and therefore, it will become difficult to perform insulation resistance measurement with substantially a high accuracy.

As explained above, in the case where the IGBT having the characteristics as illustrated in FIG. 3 is used, the temperature range in which it is possible to detect insulation deterioration of a motor with a high accuracy by the conventional technique is limited the range of temperatures in the vicinity of room temperature or lower than room temperature and it is known that in the state where the temperature is high (e.g., immediately after running a motor by an inverter etc.), such a problem will occur that the accuracy in the insulation resistance measurement of a motor and in the detection of insulation deterioration is degraded considerably because of the influence of the leakage current of the semiconductor switching elements.

As explained above, the leakage current flowing through the semiconductor switching elements of the inverter connected to both the motor winding (coil) and the DC link unit overlaps the measurement current, and therefore, particularly at the time of high temperatures when the leakage current of the semiconductor switching elements increases, there has been such a problem that the accuracy in the insulation resistance measurement of a motor reduces because of the influence of the leakage current of the semiconductor switching elements.

The present invention has been made in view of these problems and an object of the present invention is to provide a motor drive device and an insulation resistance detection method of a motor that implement exact measurement of the insulation resistance value and the insulation deterioration detection of a motor with a simple configuration by securely eliminating the influence of the leakage current flowing through semiconductor switching elements included in an inverter also when the temperature is high while using a high voltage charged across a smoothing capacitor of a DC link unit originally included in the inverter as a power source.

SUMMARY OF THE INVENTION

A motor drive device according to an embodiment of the present invention includes: a rectification circuit configured to rectify an alternating-current voltage supplied from an alternating-current power source via a first switch into a direct-current voltage; a power source unit configured to smooth a direct-current voltage rectified by the rectification circuit by a capacitor; an inverter unit configured to drive a motor by converting a direct-current voltage smoothed by the power source unit into an alternating-current voltage by a switching operation of a semiconductor switching element; a current detection unit configured to measure a value of a current flowing through a resistor one end of which is connected to a coil of the motor and the other end of which is connected to one terminal of the capacitor; a second switch that grounds the other terminal of the capacitor; and an insulation resistance detection unit configured to stop the operation of the motor, to turn off the first switch, and to detect a value of an insulation resistance of the motor, which is a resistance between the coil of the motor and the ground, by using two sets of a current value and a voltage value measured in two states, i.e., a state where the second switch is turned off and a state where the second switch is turned on.

An insulation resistance detection method of a motor according to an embodiment of the present invention includes: a step of, by a rectification circuit, rectifying an alternating-current voltage supplied from an alternating-current power source via a first switch into a direct-current voltage; a step of, by a power source unit, smoothing a direct-current voltage rectified by the rectification circuit by a capacitor; a step of, by an inverter unit, driving a motor by converting a direct-current voltage smoothed by the power source unit into an alternating-current voltage by a switching operation of a semiconductor switching element; a step of, by a current detection unit, measuring a value of a current flowing through a resistor one end of which is connected to a coil of the motor and the other end of which is connected to one terminal of the capacitor; a step of, by a voltage detection unit, measuring a voltage across both ends of the capacitor; a step of providing a second switch that grounds the other terminal of the capacitor; a step of stopping the operation of the motor and turning off the first switch; a step of turning off the second switch and measuring a current value and a voltage value; a step of turning on the second switch and measuring a current value and a voltage value; and a step of detecting a value of an insulation resistance, which is a resistance between the coil of the motor and the ground, by using two sets of a current value and a voltage value measured in two states, i.e., a state where the second switch is turned off and a state where the second switch is turned on.

DESCRIPTION OF THE DRAWINGS

These and other features and advantages of the present invention will be better understood by reading the following detailed description, taken together with the drawings wherein.

DETAILED DESCRIPTION OF THE PREFERRED EMBODIMENT

Hereinafter, with reference to the drawings, a motor drive device and an insulation resistance detection method of a motor according to the present invention are explained. However, it should be noted that the technical scope of the present invention is not limited to embodiments below but encompasses the inventions and equivalents thereof described in the claims.

First Embodiment

Figure 4:
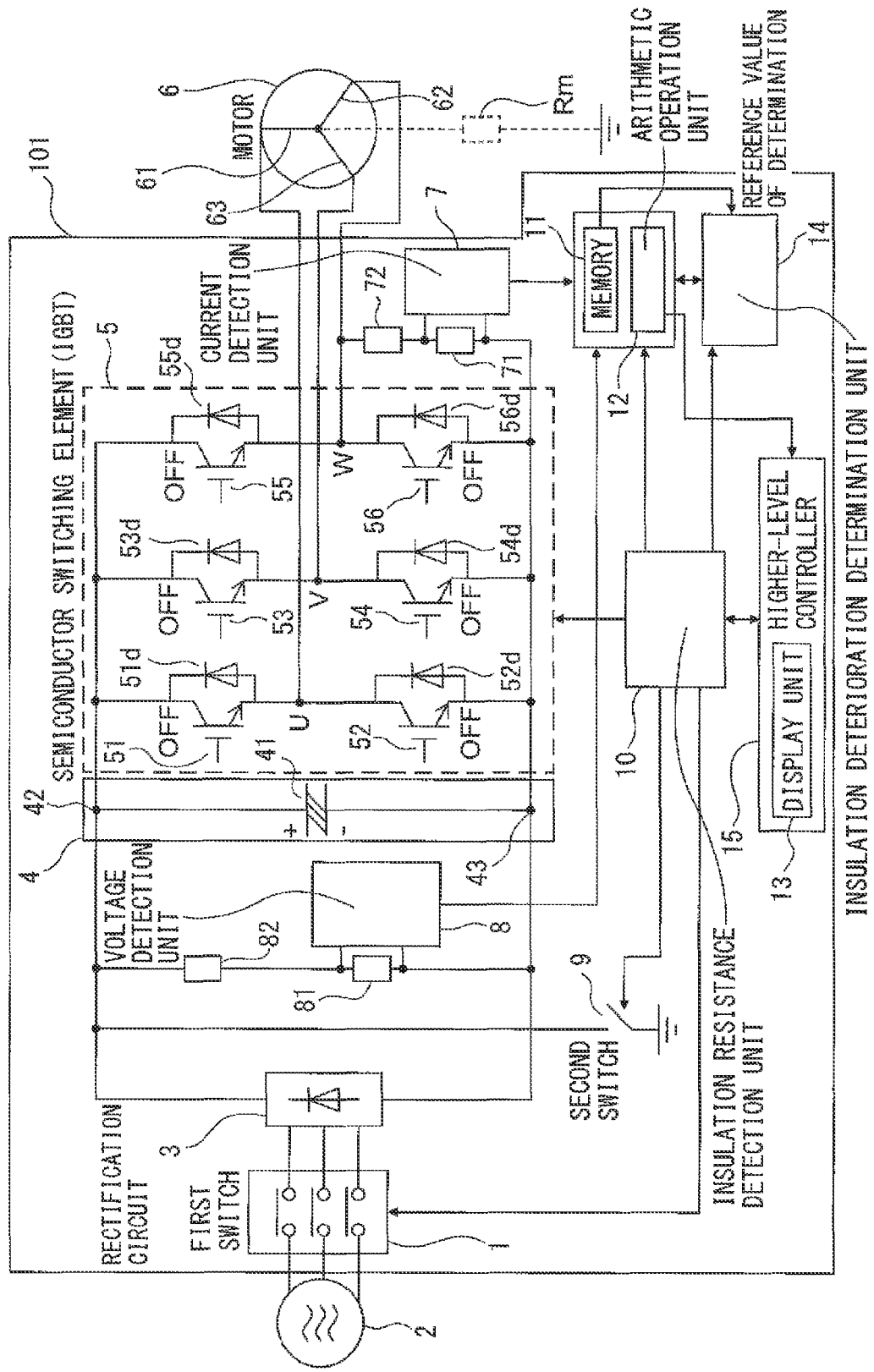
FIG. 4 is a configuration diagram of a motor drive device according to a first embodiment of the present invention.

FIG. 4 illustrates a configuration of a motor drive device according to a first embodiment of the present invention.

A motor drive device 101 according to the first embodiment of the present invention includes: a rectification circuit 3 configured to rectify an alternating-current voltage supplied from an alternating-current power source 2 via a first switch 1 into a direct-current voltage; a power source unit 4 configured to smooth a direct-current voltage rectified by the rectification circuit 3 by a capacitor 41; an inverter unit 5 including semiconductor switching elements 51 to 56 and diodes 51d to 56d connected in inversely parallel thereto and configured to drive a motor 6 by converting a direct-current voltage smoothed by the power source unit 4 into an alternating-current voltage by a switching operation of the semiconductor switching elements 51 to 56; a current detection unit 7 configured to measure a value of a current flowing through resistors 71 and 72 one end of which is connected to coils 61 to 63 of the motor 6 and the other end of which is connected to one terminal 43 of the capacitor 41; a voltage detection unit 8 configured to measure a value of a voltage across both ends of the capacitor 41; a second switch 9 that grounds the other terminal 42 of the capacitor 41; and an insulation resistance detection unit 10 configured to stop the operation of the motor 6, to turn off the first switch 1, and to detect a value of an insulation resistance, which is a resistance between the coils 61 to 63 of the motor and the ground, by using two sets of a current value and a voltage value measured in two states, i.e., a state where the second switch 9 is turned off and a state where the second switch 9 is turned on.

Figure 5:
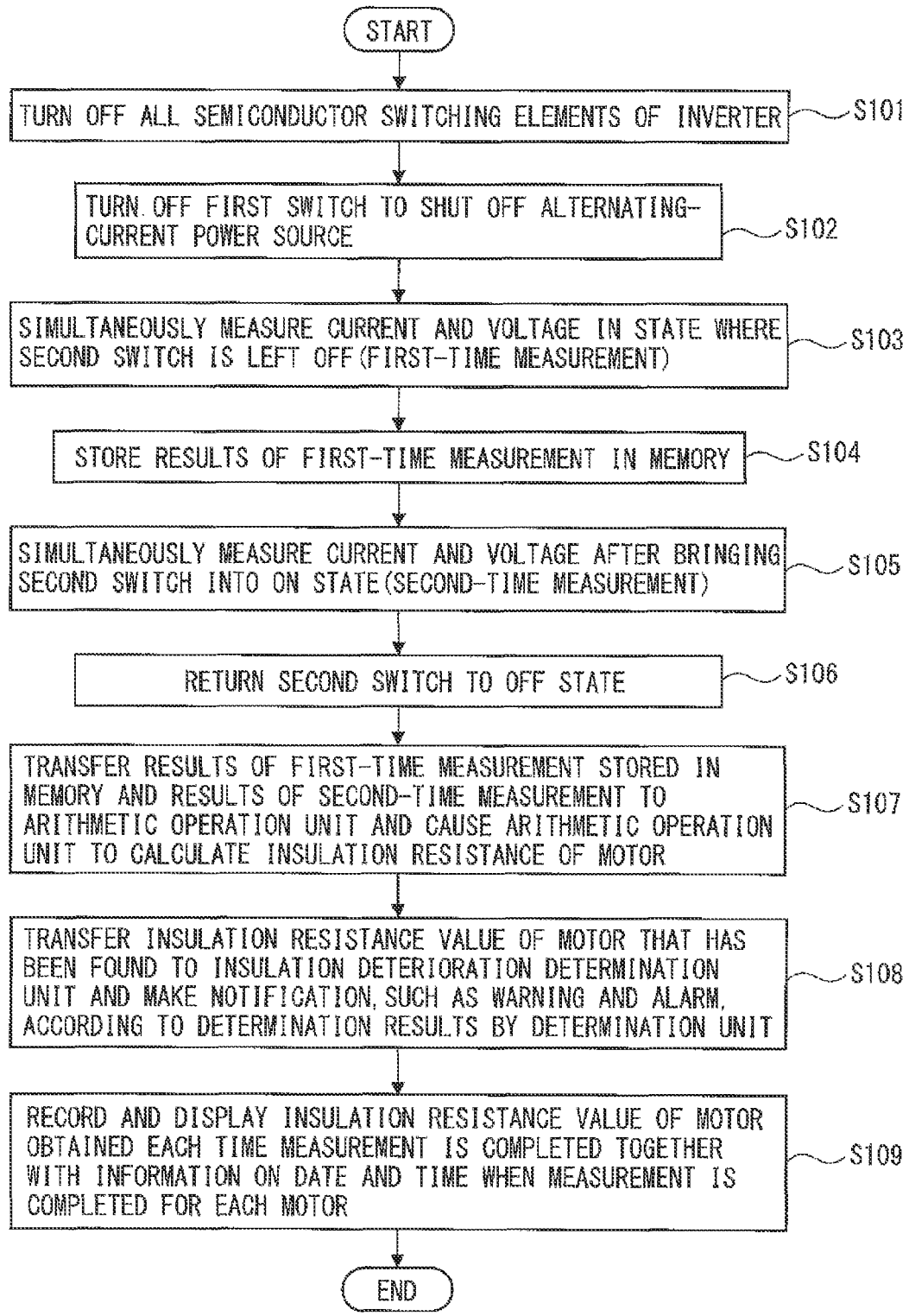
FIG. 5 is a flowchart illustrating a processing procedure of an insulation deterioration detection method using the motor drive device according to the first embodiment of the present invention.

The insulation resistance measurement of a motor is performed as follows. FIG. 5 illustrates a flowchart for explaining the processing procedure of the insulation deterioration detection method using the motor drive device according to the first embodiment of the present invention. First, at step S101, the operation of the motor 6 is stopped and all the semiconductor switching elements 51 to 56 of the inverter 5 are brought into the OFF state in order to measure the insulation resistance of the motor.

Next, at step S102, the alternating-current power source 2 is shut off by turning off the first switch 1. Next, at step S103, in the state where the second switch 9 that connects the plus side terminal 42, which is one end of the capacitor 41, to the ground is turned off, the voltage detection unit 8 measures the voltage across both ends of the capacitor 41 and the current detection unit 7 measures the current flowing through the detection resistor 71 that connects one end of the motor coil and the minus side terminal 43, which is the other end of the capacitor 41. At this time, the first-time measurement is performed in which the voltage and the current are measured at the same timing by causing the voltage detection unit 8 and the current detection unit 7 to operate at the same timing. By measuring the value of the voltage across both ends of the capacitor 41 and the current value of the current detection unit 7 at the same timing as described above, the first-time measurement for finding the leakage current flowing through the semiconductor switching elements and the equivalent insulation resistance value of the semiconductor switching elements is performed. Next, at step S104, processing to store the results of the first-time measurement in a memory 11 is performed.

Figure 1:
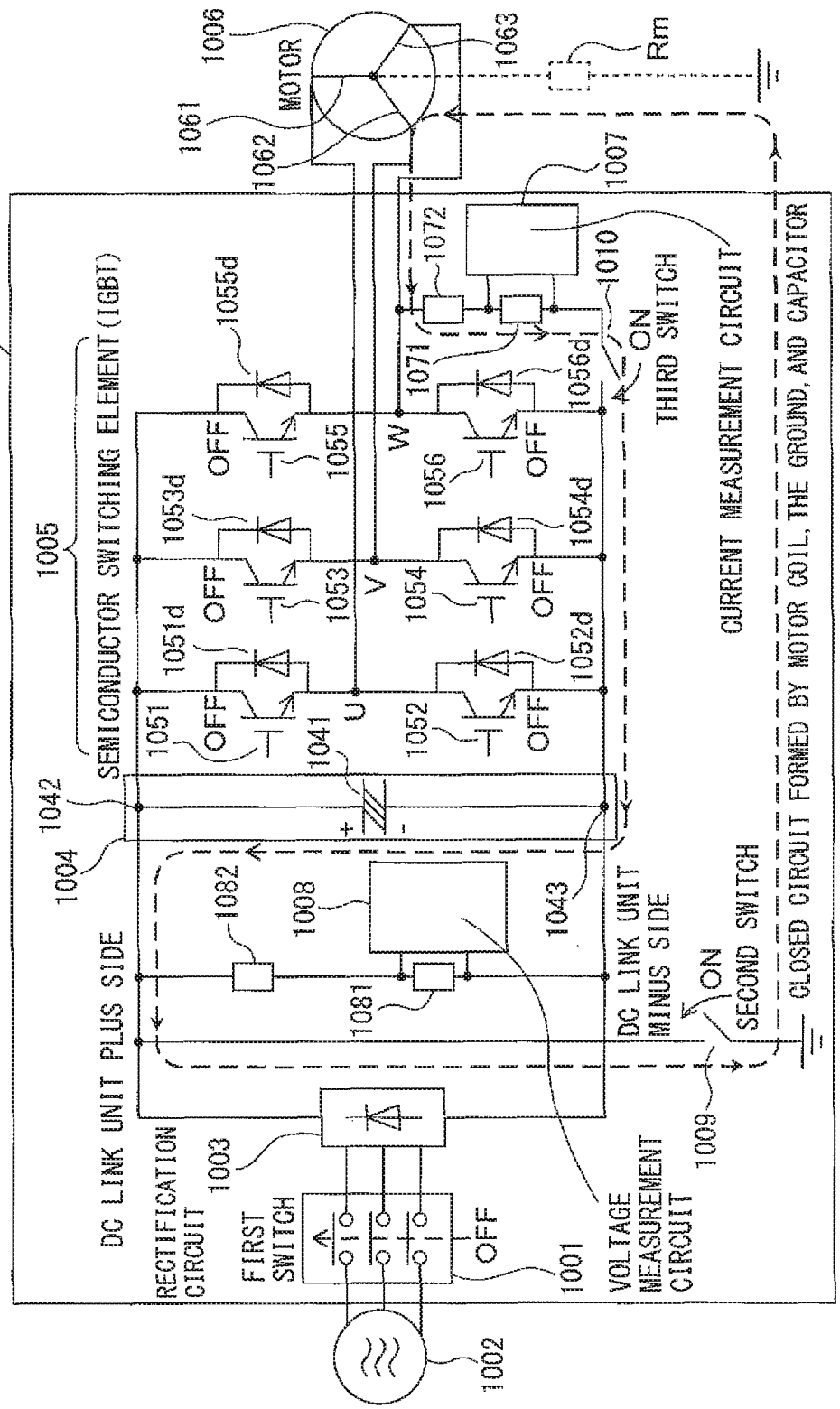
FIG. 1 is a configuration diagram of a conventional motor drive device.
Figure 2:
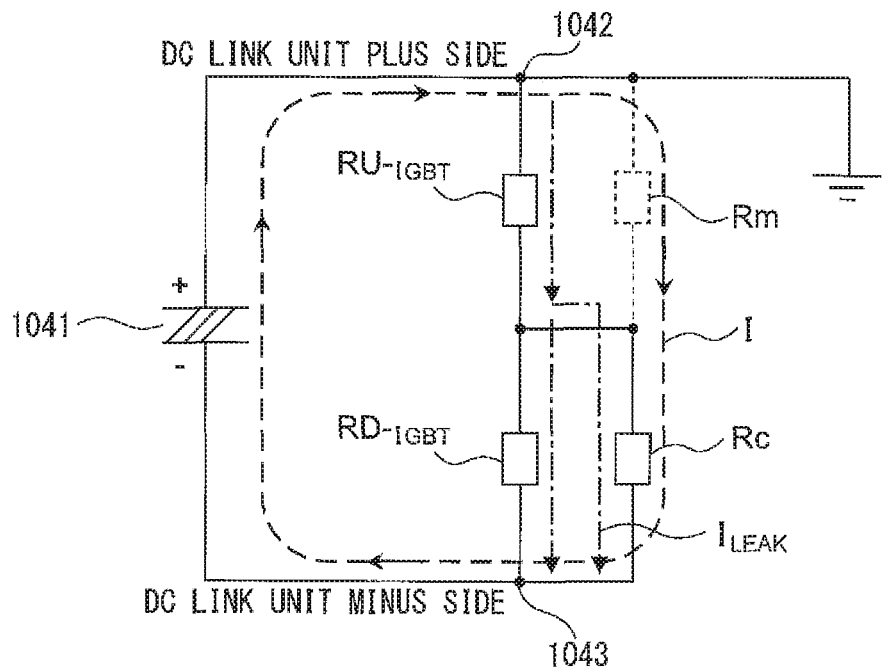
FIG. 2 is an equivalent circuit of a closed circuit and a semiconductor switching element at the time of the insulation resistance measurement of the conventional motor drive device.

In the conventional technique, a switch, like the third switch 1010 in FIG. 1, for connecting and disconnecting the current measurement circuit 1007 is provided, but in the motor drive device 101 according to the first embodiment of the present invention, by increasing the resistance value of the voltage division resistor 72 of the current detection unit 7 and by reducing the current flowing through the current detection unit 7 when the motor 6 is in operation to a level that does not affect the operation of the motor 6, a switch that disconnects the current detection unit 7 is not provided and the current detection unit 7 is connected at all times.

The first-time measurement is measurement in the state where the second switch 9 is turned off, and therefore, the current does not flow to the ground but only flows from the plus side terminal 42 to the minus side terminal 43 of the capacitor through the semiconductor switching elements 51 to 56 and the resistors 71 and 72 of the current detection unit 7. Consequently, it is possible to represent an equivalent current at the time of the first-time measurement as in FIG. 6.

Figure 6:
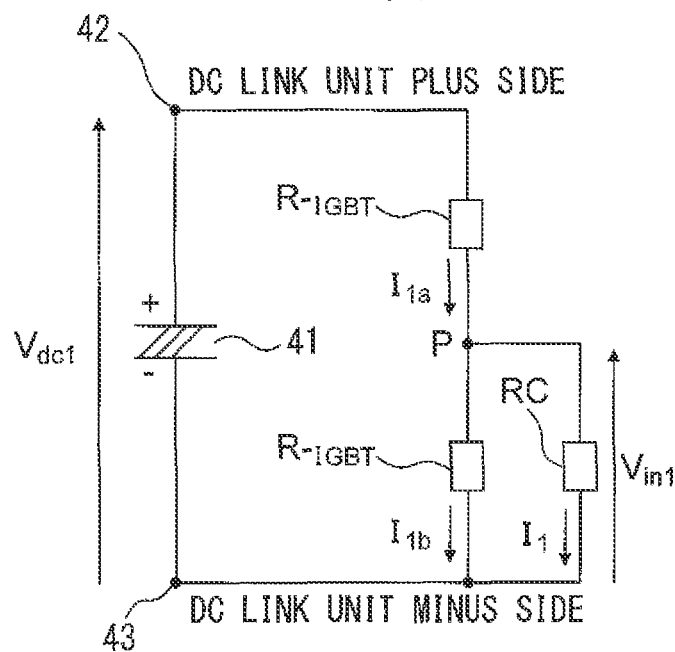
FIG. 6 is an equivalent circuit diagram at the time of (first-time) measurement in the case where a second switch is turned off using the motor drive device according to the first embodiment of the present invention.

In FIG. 6, two upper and lower resistors $R_{-IGBT}$ connected in series represent the insulation resistance value when the semiconductor switching elements 51, 53, and 55 of the upper arm of the inverter 5 are OFF and the insulation resistance value when the semiconductor switching elements 52, 54, and 56 of the lower arm are OFF, respectively, and RC represents the serial connection of the voltage division resistor 72 and the detection resistor 71 of the current detection unit 7 as one resistor.

The insulation resistance when the semiconductor switching elements 51 to 56 are OFF means, in the case where the IGBT is used as the semiconductor switching element, the equivalent insulation resistance between the collector and emitter of the IGBT in the OFF state, which is obtained by dividing the voltage that is applied between the collector and emitter of the IGBT in the state where the IGBT is turned off by the leakage current that flows from the collector to emitter in the OFF state.

In FIG. 4, the example is illustrated in which a three-phase motor is used as the motor 6. In the case of the inverter that drives a three-phase motor, there exist three serial connections of two sets of semiconductor switching elements of the upper arm and the lower arm connected to both ends of the capacitor 41 as a result. However, each of the connection points of the semiconductor switching elements of the upper arm and the lower arm is connected between terminals of each phase of the motor and the three terminals of each phase of the motor are connected to one another through the motor coils 61 to 63. Because of this, it can be considered that the upper $R_{-IGBT}$ is the combined resistance when the three power switching elements of the upper arm are connected in parallel and the lower $R_{-IGBT}$ is the combined resistance when the three power switching elements of the lower arm are connected in parallel.

Figure 3:
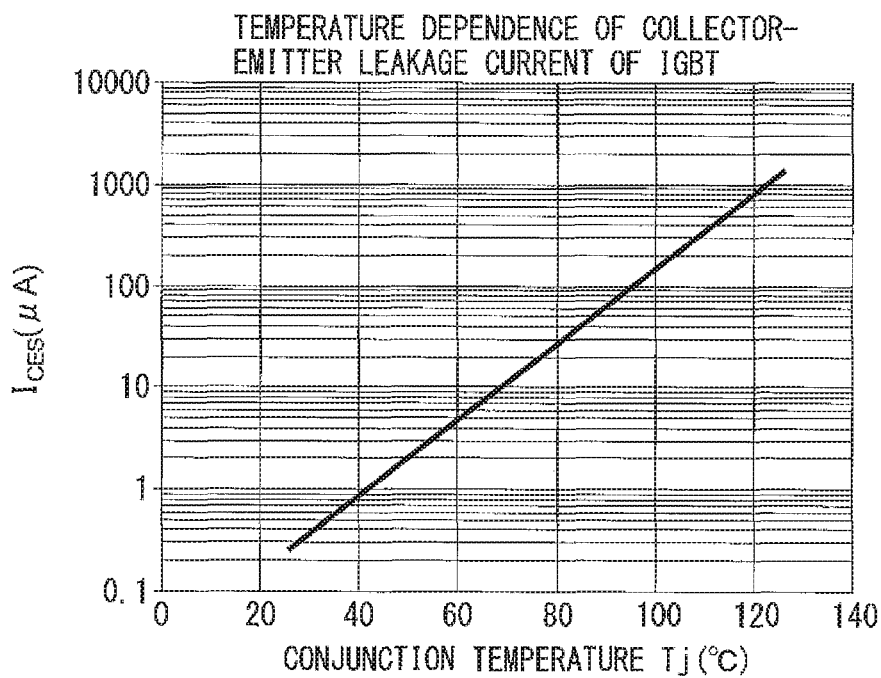
FIG. 3 is a graph indicating a temperature dependence of a collector-emitter leakage current when an IGBT is OFF.

Further, as the two sets of semiconductor switching elements connected in series of the upper arm and the lower arm, those having the same electrical characteristics are used in the inverter 5 usually. Because of this, as explained by using FIG. 3, it can be considered that the equivalent insulation resistance value of the semiconductor switching elements of the upper arm is equal to that of the semiconductor switching elements of the lower arm.

In the equivalent circuit in FIG. 6, if a DC link voltage $V_{dc1}$ across both ends of the capacitor 41 that is measured by the voltage detection unit 8, a current $I_1$ flowing through the current detection resistor RC that is measured by the current detection unit 7, and a voltage $V_{in1}$ across both ends of the RC are known from the results of the measurement, the resistance value of the RC is already known, and therefore, by applying Kirchhoff's law while paying attention on the current that flows in and out at a P point, it is possible to find the equivalent insulation resistance value $R_{-IGBT}$ of the semiconductor switching element by the calculation of an arithmetic operation unit 12.

Specifically, as illustrated in FIG. 6, by applying Kirchhoff's first law at the node P, it is possible to calculate the equivalent insulation resistance value $R_{-IGBT}$. First, the current flowing through the RC of the current measurement circuit is taken to be $I_1$, the current flowing through the IGBT of the upper arm is taken to be $I_{1a}$, and the current flowing through the IGBT of the lower arm is taken to be $I_{1b}$. By applying Kirchhoff's first law at the node P, a relational expression below is obtained because the sum of currents flowing in from all the branches connected to one node is zero.

$$I_{1a} - I_{1b} - I_1 = 0 \quad (1)$$

If $I_{1a}$, $I_{1b}$, and $I_1$ in the above-described expression (1) are represented by using the measured voltages $V_{dc1}$ and $V_{in1}$ and each resistance value $R_{-IGBT}$, and the RC, an expression (2) below is obtained.

$$\frac{(V_{dc1} - V_{in1})}{R_{-IGBT}} - \frac{V_{in1}}{R_{-IGBT}} - \frac{V_{in1}}{RC} = 0 \quad (2)$$

By simplifying the expression (2), an expression (3) for calculating the $R_{-IGBT}$ is obtained.

$$\therefore R_{\_IGBT} = \frac{(V_{dc1} - 2V_{in1})}{V_{in1}} RC \quad (3)$$

The voltage $V_{dc1}$ across both ends of the capacitor 41 obtained by the first-time measurement, the current $I_1$ flowing through the current detection resistor RC that is measured by the current detection unit 7, the voltage $V_{in1}$ across both ends of the RC, and the insulation resistance value of $R_{\_IGBT}$ obtained as the result of calculation by the arithmetic operation unit 12 are stored in the memory 11 because these are used later to find the insulation resistance of the motor.

Next, at step S105, in the state where the second switch 9 that connects the plus side terminal 42, which is one end of the capacitor 41, to the ground is turned on, the voltage charged across the capacitor 41 is applied between the coils 61 to 63 of the motor and the ground and thus a current is caused to occur, which flows through a closed circuit formed by the capacitor 41, the coils 61 to 63 of the motor, and the ground. In this state, by using the voltage detection unit 8 that measures the voltage across both ends of the capacitor 41 and the current detection unit 7 that measures the current flowing through the detection resistor 71 that connects one end of the coils 61 to 63 of the motor and the minus side terminal 43, which is the other end of the capacitor, second-time measurement for finding the insulation resistance value between the coils 61 to 63 of the motor and the ground is performed by measuring the voltage value across both ends of the capacitor 41 and the current value of the current detection unit 7 at the same timing. In the second-time measurement, the voltage and the current are measured at the same timing by causing the voltage detection unit 8 and the current detection unit 7 to operate at the same timing. After the second-time measurement, the second switch 9 is returned to the OFF state at step S106.

Figure 7:
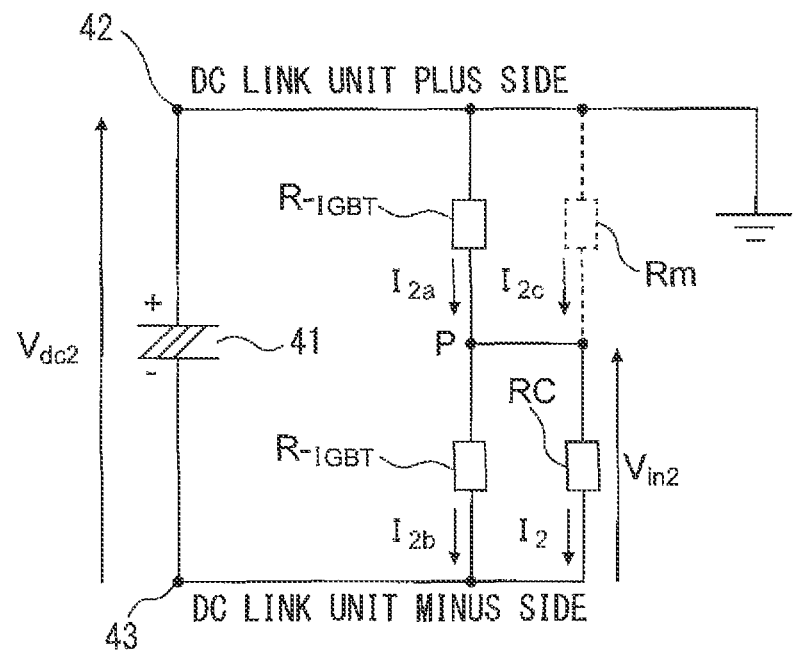
FIG. 7 is an equivalent circuit diagram at the time of (second-time) measurement in the case where the second switch is turned off using the motor drive device according to the first embodiment of the present invention.

It is possible to represent the equivalent circuit at the time of the second-time measurement as in FIG. 7. Rm in FIG. 7 represents the insulation resistance, which is to be found, between the coils 61 to 63 of the motor and the ground. As in FIG. 6, "$R_{\_IGBT}$" represents the equivalent insulation resistance value when the semiconductor switching elements 51 to 56 are OFF, and "RC" represents the serial connection of the detection resistor 71 and the voltage division resistor 72 of the current detection unit 7 by one resistor. The circuit in FIG. 7 is the equivalent circuit in FIG. 6 to which the connection of the insulation resistor Rm between the ground and the motor coil is added. It is known that at the time of the second-time measurement, in the current detection unit 7, the current value that combines the value of the current flowing through the closed circuit formed by the capacitor 41, the coils 61 to 63 of the motor, and the ground and the value of part of the leakage current flowing through the semiconductor switching elements 51 to 56 in the OFF state is measured.

Next, at step S107, the results of the second-time measurement are stored in the memory and the processing to perform an arithmetic operation to find the insulation resistance value from the results of the first-time measurement and the second-time measurement, respectively, is performed. In the equivalent circuit in FIG. 7, if a DC link voltage $V_{dc2}$ across both ends of the capacitor, which is measured by the voltage detection unit 8, a current $I_2$ flowing through the current detection resistor RC, which is measured by the current detection unit 7, and a voltage $V_{in2}$ across both ends of the RC are known from the results of the measurement, the resistance value of the RC is already known and the equivalent insulation resistance value $R_{\_IGBT}$ of the semiconductor switching elements 51 to 56 that has been found by the arithmetic operation from the results of the previous measurement is also known, and therefore, it is possible to find the insulation resistance Rm between the motor and the ground by calculation, which is the only one unknown value in the equivalent circuit in FIG. 7 in which four resistors are connected in the form of an H bridge.

It is possible to calculate the insulation resistance Rm as follows by applying Kirchhoff's first law at the node P and substituting a calculation expression that has been found from the results of the first-time measurement in the value of $R_{\_IGBT}$. First, as illustrated in FIG. 7, the current flowing through the RC of the current measurement circuit is taken to be $I_2$, a current flowing through the IGBT of the upper arm to be $I_{2a}$, a current flowing through the IGBT of the lower arm to be $I_{2b}$, and a current flowing through the insulation resistor Rm of the motor to be $I_{2c}$. If Kirchhoff's first law is applied at the node P, the sum of the currents that flow in from all the branches connected to one node is zero, and therefore, a relational expression below is obtained.

$$I_{2a} + I_{2c} - I_{2b} - I_2 = 0 \quad (4)$$

If $I_{2a}$, $I_{2b}$, $I_{2c}$, and $I_2$ in the above-described expression (4) are represented by using the measured voltages $V_{dc2}$ and $V_{in2}$ and each resistance value $R_{\_IGBT}$, the Rm, and the RC, an expression (5) below is obtained.

$$\frac{(V_{dc2} - V_{in2})}{R_{\_IGBT}} + \frac{(V_{dc2} - V_{in2})}{Rm} - \frac{V_{in2}}{R_{\_IGBT}} - \frac{V_{in2}}{RC} = 0 \quad (5)$$

By simplifying the expression (5), an expression (6) below is obtained.

$$\frac{(V_{dc2} - 2V_{in2})}{R_{\_IGBT}} + \frac{(V_{dc2} - V_{in2})}{Rm} - \frac{V_{in2}}{RC} = 0 \quad (6)$$

By substituting the expression (3) for finding $R_{\_IGBT}$ that has been found by the first-time measurement in the above-described expression (6) and by simplifying the expression (6), an expression (7) below is obtained.

$$\frac{(V_{dc2} - 2V_{in2})V_{in1}}{(V_{dc1} - 2V_{in1})RC} + \frac{(V_{dc2} - V_{in2})}{Rm} - \frac{V_{in2}}{RC} = 0 \quad (7)$$

By simplifying the expression (7), an expression (8) below is obtained.

$$\frac{(V_{dc2}V_{in1} - V_{dc1}V_{in2})}{(V_{dc1} - 2V_{in1})RC} + \frac{(V_{dc2} - V_{in2})}{Rm} = 0 \quad (8)$$

By using the equation (8), an equation (9) for finding the insulation resistance Rm of the motor is obtained from two sets of the current value and the voltage value including the results $V_{dc1}$ and $V_{in1}$ of the first-time measurement and the results $V_{dc2}$ and $V_{in2}$ of the second-time measurement, and the already-known resistance value RC of the current detection resistor.

$$Rm = \frac{(V_{dc1} - 2V_{in2})(V_{dc2} - V_{in2})}{(V_{dc1}V_{in2} - V_{dc2}V_{in1})} RC \quad (9)$$

By sequentially performing the above series of processing, it is possible to detect the insulation resistance value Rm of the motor. Further, at step S108, it is also possible to add a step, which is performed by an insulation deterioration determination unit 14, of performing processing to give a warning or an alarm to report the degree of insulation deterioration obtained by comparing the obtained insulation resistance value of the motor with a reference value. Furthermore, at step S109, it is also possible to add processing to record and display the insulation resistance value of the motor obtained each time the measurement is completed together with information on the date and time when the measurement is completed for each motor.

In the flowchart in FIG. 5, it may also be possible to change the order of the first-time measurement (step S103) and the second-time measurement (step S105).

In the manner as described above, by using $V_{dc2}$, $I_2$, and $V_{in2}$ obtained by the second-time measurement, the results $V_{dc1}$, $I_1$, and $V_{in1}$ of the first-time measurement stored in the memory 11, and $R_{\_IGBT}$ that has been found by the arithmetic operation from the results of the first-time measurement, the exact insulation resistance value Rm of the motor is found by calculation by the arithmetic operation unit 12, and the insulation resistance value Rm of the motor that has been found is compared with the reference value in the insulation deterioration determination unit 14, and then a notification or a display, such as a warning and an alarm, is given in accordance with the degree of the reduction in the insulation resistance value of the motor based on the results of the comparison.

With regard to the calculation for finding the insulation resistance value Rm of the motor in the arithmetic operation unit 12, in the above-described explanation, the method for calculating the insulation resistance value Rm of the motor from the results of the second-time measurement by using the value of $R_{\_IGBT}$ after temporarily finding the equivalent insulation resistance value $R_{\_IGBT}$ of the semiconductor switching elements from the results of the first-time measurement is explained. However, it may also be possible to directly find the insulation resistance Rm between the motor and the ground by calculation from the values $V_{dc1}$, $I_1$, and $V_{in1}$ of the first-time measurement and the values $V_{dc2}$, $I_2$, and $V_{in2}$ of the second-time measurement by regarding the value of $R_{\_IGBT}$ as variables of the values $V_{dc1}$, $I_1$, and $V_{in1}$ of the first-time measurement without performing calculation for finding the value of the $R_{\_IGBT}$.

Further, with regard to the order of measurement, in the above explanation, the example is described in which the first-time measurement is performed in the state where the second switch 9 that connects the plus side terminal 42, which is one end of the capacitor 41, to the ground is turned off and next, the second-time measurement is performed in the state where the second switch 9 is turned on. However, it may also be possible to perform measurement in the order opposite to that in the above-described explanation. In other words, it is possible to finally perform an arithmetic operation by using measured values of the measurement performed twice after storing the measured results obtained by the measurement performed twice, and therefore, the order of measurement is not restricted.

Further, the insulation resistance value of the motor that has been found by the calculation in the arithmetic operation unit 12 is delivered to a higher-level controller 15 via the insulation resistance detection unit 10 as the results of the measurement of the insulation resistance of the motor as well as being used for determination of the insulation deterioration detection of the insulation deterioration determination unit 14.

In either case, the present invention is characterized in that by performing measurement twice in the state where the second switch 9 that connects the plus side terminal 42, which is one end of the capacitor 41, to the ground is turned off and in the state where the second switch 9 is turned on, the equivalent insulation resistance of the semiconductor switching elements in the OFF state, in other words, the influence of the leakage current of the semiconductor switching elements is found exactly by calculation of the results of the measurement performed twice, and thereby, the exact insulation resistance value of the motor after the influence of the leakage current of the semiconductor switching elements is perfectly eliminated is found.

Further, it may also be possible to further include a display unit 13 configured to display the results of the insulation deterioration determination by comparing the insulation resistance value that has been found with a reference value set in advance. Furthermore, it may also be possible to record the results of the measurement of the insulation resistance value of each motor together with information on date and time of the measurement each time the measurement of the insulation resistance value of the motor is completed, and to display the history of the recorded date and time and the insulation resistance value of the motor on the display unit 13.

Still furthermore, as illustrated in FIG. 4, it may also be possible to cause the insulation resistance detection unit 10 to transmit the results of the measurement of the insulation resistance value of the motor 6, a measurement completion signal indicating the timing at which the measurement is completed, and the results of the insulation deterioration determination to the higher-level controller 15.

Figure 10:
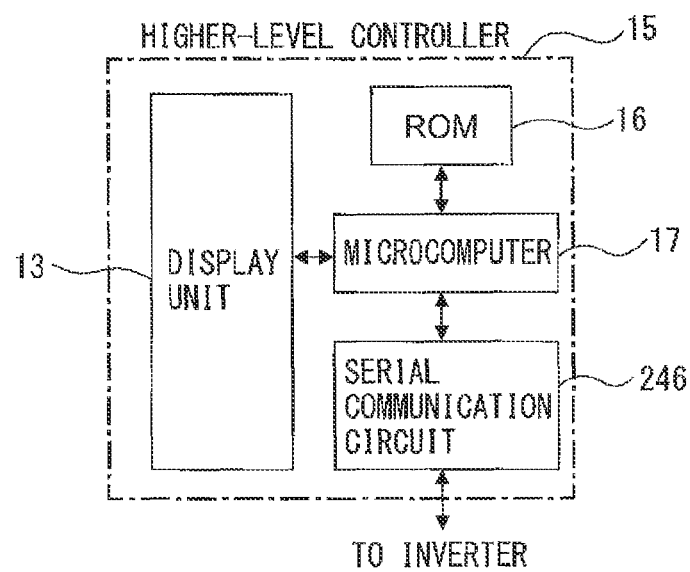
FIG. 10 is a configuration diagram of a higher-level controller.

A configuration example of the higher-level controller 15 is illustrated in FIG. 10. The higher-level controller 15 is numerically controlled equipment that provides instructions to drive the motor 6 to each inverter 5. The higher-level controller 15 includes a serial communication circuit 246 for communicating with each inverter 5, a microcomputer 17 having a built-in function to check information on date and time, a nonvolatile ROM 16, and the display unit 13. Further, the higher-level controller 15 displays the history of the results of the measurement of the insulation resistance of each motor and the information on data and time in the past recorded in the ROM 16 on the display unit 13 as well as recording information in which information on date and time when the measurement completion signal is received from the insulation resistance detection unit 10 and the measured insulation resistance value are caused to correspond to each other in a one-to-one manner for each motor in the ROM 16.

It is possible for a user to display the transition of the insulation resistance value of each motor 6 at each date and time of the measurement from the past to the present time on the display unit 13 of the higher-level controller 15 by operating the higher-level controller 15. Alternatively, it is possible to make use of the data to protect and maintain a machine that uses the motor drive device 101 because the data can be read and checked from the ROM 16 within the higher-level controller 15.

Second Embodiment

Figure 8:
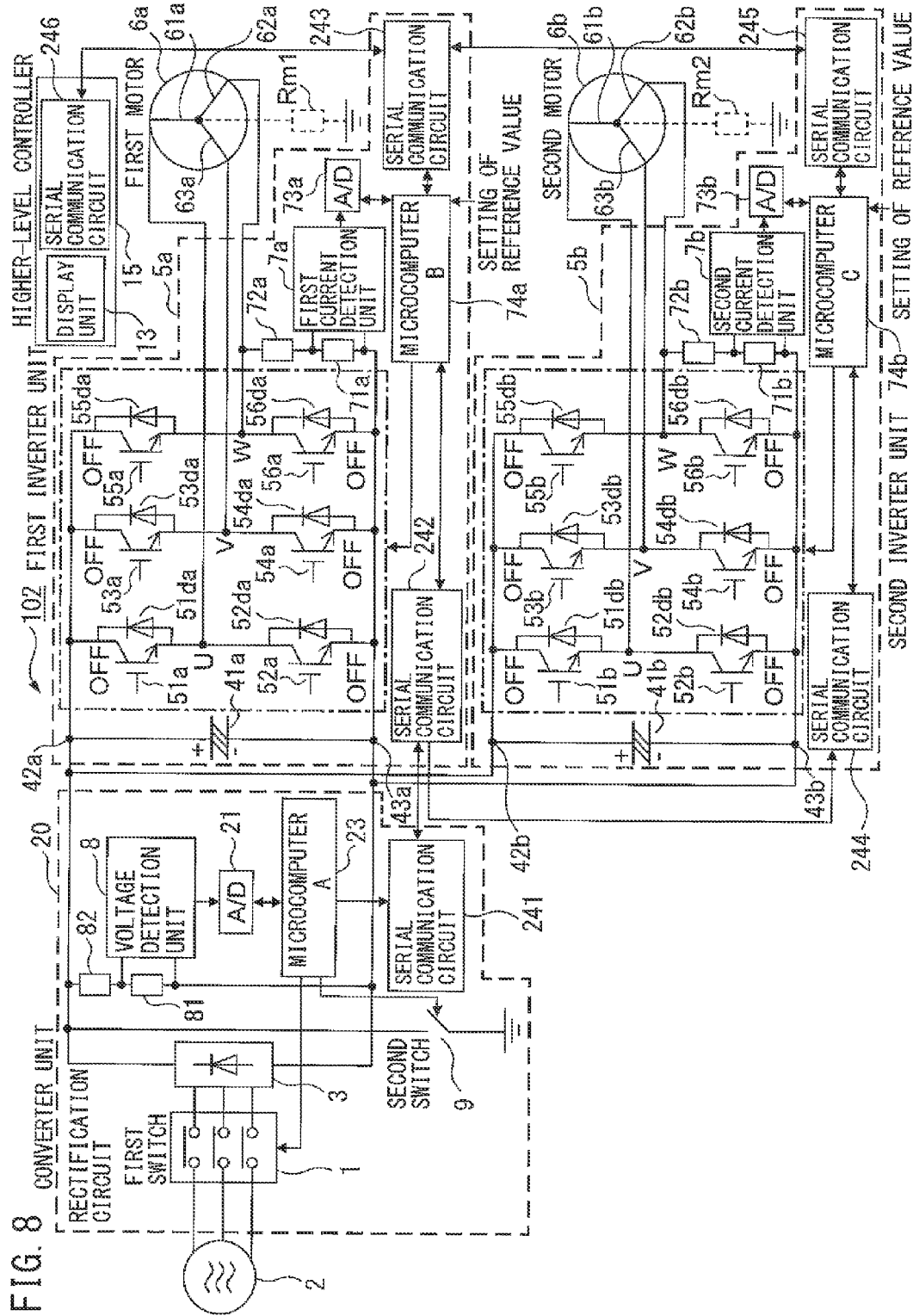
FIG. 8 is a configuration diagram of a motor drive device according to a second embodiment of the present invention.

Next, a motor drive device according to a second embodiment is explained. FIG. 8 illustrates a configuration of a motor drive device 102 according to the second embodiment. In the second embodiment, the motor drive device 102 drives a plurality of motors 6a and 6b and it is made possible to perform exact insulation resistance measurement of a motor after eliminating the influence of the leakage currents flowing through semiconductor switching elements 51a to 56a and 51b to 56b and to perform insulation deterioration detection.

To the first motor 6a, a first inverter 5a including the semiconductor switching elements 51a to 56a and diodes 51da to 56da connected in inversely parallel thereto is connected. To the second motor 6b, a second inverter 5b including the semiconductor switching elements 51b to 56b and diodes 51db to 56db connected in inversely parallel thereto is connected. By performing first-time measurement for finding the influence of the leakage currents flowing through the semiconductor switching elements 51a to 56a and 51b to 56b, respectively, of each of the first and second inverters 5a and 5b, and for finding an equivalent insulation resistance value of the semiconductor switching elements for each motor, and second-time measurement for finding an insulation resistance value between coils 61a to 63a of the first motor and the ground and an insulation resistance value between coils 61b to 63b of the second motor and the ground, it is possible to find an exact insulation resistance value of the motor after eliminating the influence of the leakage currents flowing through the semiconductor switching elements 51a to 56a and 51b to 56b for each of the first and second motors 6a and 6b from the results of the measurement performed twice.

In the second embodiment, the first-time measurement and the second-time measurement are performed at a time at the same timing in the common voltage detection unit 8 and in first and second current detection units 7a and 7b of the first and second inverter units 5a and 5b, respectively.

The number of times of measurement remains the same even in the case where there is a plurality of motors and only by performing measurement twice in the state where the second switch 9 is turned off and in the state where the second switch 9 is turned on, it is possible to obtain the insulation resistance values of all the motors and to perform insulation deterioration detection for each motor.

In the motor drive device 102 according to the second embodiment illustrated in FIG. 8, to one power source unit (converter unit) 20, the first inverter unit 5a configured to drive the first motor 6a and the second inverter unit 5b configured to drive the second motor 6b are connected. Rm1 and Rm2 represent the insulation resistance value between the coils 61a to 63a of the first motor 6a and the ground and the insulation resistance value between the coils 61b to 63b of the second motor 6b and the ground, respectively. In the example in FIG. 8, the first inverter unit 5a and the second inverter unit 5b are provided with a smoothing capacitor 41a and a smoothing capacitor 41b, respectively, but these two capacitors 41a and 41b are connected in parallel, and therefore, they function as one capacitor having an electrostatic capacitance, which is the total capacitance of the two capacitors.

FIG. 8 illustrates an example of the motor drive device that drives the two motors 6a and 6b, but it is needless to say that the number of motors is not limited to that in this example in the second embodiment.

In the second embodiment, as illustrated in FIG. 8, the rectification circuit 3 configured to rectify an alternating-current voltage supplied from the alternating-current power source 2 via the first switch 1 into a direct-current voltage, the second switch 9 that connects a plus side terminal 42a and a plus side terminal 42b, which are each one end of the capacitor 41a and the capacitor 41b, respectively, which smooth the output of the rectification circuit 3, to the ground, and the voltage detection unit 8 (and an AD converter 21 that converts the output thereof into a digital value) configured to measure the voltage across both ends (42a and 43a) of the capacitor 41a and the voltage across both ends (42b and 43b) of the capacitor 41b can be shared between the first and second inverters 5a and 5b, and therefore, it is not necessary to have each of those units in plurality for each motor but only one is sufficient.

In contrast to this, the first and second current detection units 7a and 7b (and AD converters 73a and 73b that convert the outputs thereof into digital values) exist in plurality for the pair of the first motor 6a and the first inverter 5a that drives the motor 6a and for the pair of the second motor 6b and the second inverter 5b that drives the motor 6b, respectively, and as the current values, the values measured by the first and second current detection units 7a and 7b corresponding to each motor are used and as the voltage value, the value measured by the single voltage detection unit 8 in common to all the motors is used. By this configuration, it is possible to exactly find the influence of the leakage current flowing through the semiconductor switching elements 51a to 56a in the OFF state and the influence of the leakage current flowing through the semiconductor switching elements 51b to 56b for each of the pair of the motor and the first inverter 5a that drives the motor and the pair of the motor and the second inverter 5b that drives the motor, and the equivalent insulation resistance value of the semiconductor switching elements for each motor.

As described above, in the conventional technique, a switch, like the third switch 1010 in FIG. 1, which connects and disconnects the current measurement circuit of each inverter 1005 was provided. In contrast to this, in the present invention, as illustrated in FIG. 8, by increasing the resistance values of voltage division resistors 72a and 72b of the first and second current detection units 7a and 7b to reduce the currents flowing through the first and second current detection units 7a and 7b when the motors are in operation to values that will not affect the operation of the motors, switches to disconnect the first and second current detection units 7a and 7b are not provided and the first and second current detection units 7a and 7b are left connected at all times. Due to this, the switches of the current detection units, which were necessary in the number corresponding to that of the inverters in the conventional technique, are removed and a simple and low-cost insulation resistance detection unit is implemented.

Figure 9:
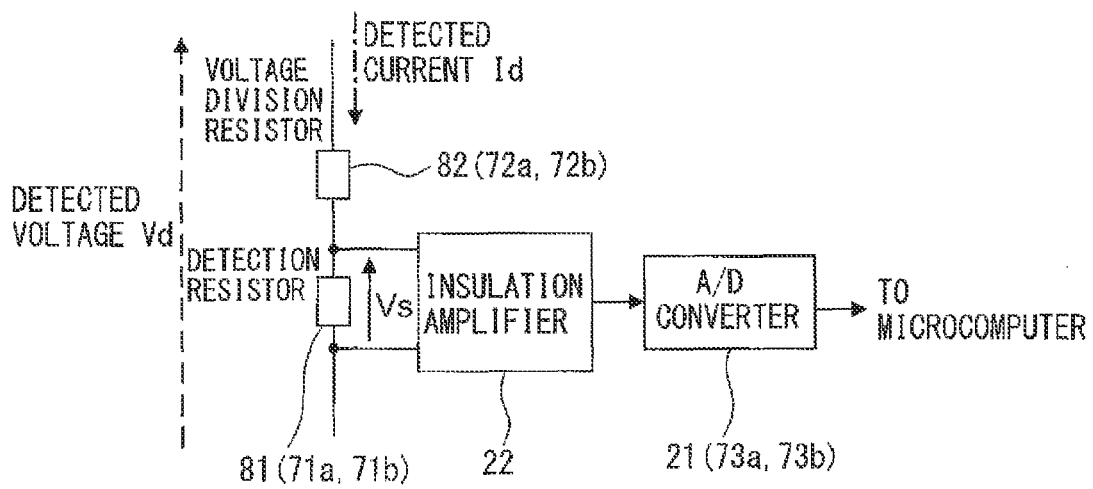
FIG. 9 is a specific configuration diagram of a circuit of a voltage detection unit of a converter unit and a circuit of a current detection unit of an inverter unit in FIG. 8.

FIG. 9 illustrates a specific configuration example of the circuit of the voltage detection unit 8 of the converter unit 20 and the circuit of the first and second current detection units 7a and 7b of the first and second inverter units 5a and 5b in FIG. 8. Each of the circuits is a circuit configured to measure a voltage Vs that appears across both terminals of the detection resistor and the resistance values of a detection resistor 81 (or 71a, 71b) and a voltage division resistor 82 (72a, 72b) are already known, and therefore, in the first and second inverter units 5a and 5b, the circuit is used as a current measurement circuit for finding a value of a current Id flowing through the detection resistor 81 (or 71a, 71b) from the measurement results, and in the converter unit, the circuit is used as a voltage measurement circuit for finding a voltage across both ends of the serial connection of the voltage division resistor 82 and the detection resistor 81 from the voltage division ratio of the resistor.

Both the detection resistor of the circuit of the voltage detection unit 8 of the converter unit 20 and the detection resistors of the circuits of the first and second current detection units 7a and 7b of the first and second inverter units 5a and 5b are connected to the circuits on the primary side. Because of this, the detected voltage converted into a secondary potential by using an insulation amplifier 22 is input to the AD converter 21 (or 73a, 73b) and thus is converted into a digital value.

"A/D" in FIG. 8 indicates an "A/D converter" and is the same as the "A/D converter" in FIG. 9.

In FIG. 8, the "insulation resistance detection unit" in FIG. 4 is implemented by microcomputers A to C (23, 74a, 74b). By the microcomputers A to C (23, 74a, 74b) giving instructions at appropriate timing in accordance with the flowchart as illustrated in the example in FIG. 5, processing necessary for measurement is implemented, such as the operation to turn off the semiconductor switching elements 51a to 56a and 51b to 56b of the first and second inverter units 5a, 5b, the operation to turn ON/OFF the first switch 1 and the second switch 9, and the AD conversion operation of the AD converters 21, 73a, and 73b for taking in the measured values of the voltage detection unit 8 and the first and second current detection units 7a and 7b.

In FIG. 8, the "memory 11", the "arithmetic operation unit 12", and the "insulation deterioration determination unit 14" in FIG. 4 are also implemented by the microcomputers A to C (23, 74a, 74b). The microcomputers A to C (23, 74a, 74b) read the measurement results of the voltage detection unit 8 and the first and second current detection units 7a and 7b as digital values from the AD converters 21, 73a, and 73b as respectively. In the present invention, the measurement is performed twice and each measured value is held until the final arithmetic operation is performed inside the microcomputers A to C (23, 74a, 74b) and by using the measured values held after the second-time measurement, the insulation resistance value of the motor is found by the arithmetic operation of the microcomputers B and C (74a, 74b). The processing to determine insulation deterioration by comparing the insulation resistance value of the motor that has been found with the reference value and to report the determination results to the outside is also performed in the microcomputers B and C (74a, 74b).

In FIG. 8, one microcomputer A (23) is provided in the common converter unit 20 and is provided in the first inverter unit 5a and in the second inverter unit 5b, respectively, and the respective microcomputers are connected with one another by serial communication. This configuration is a configuration example suitable to the case where the converter unit, the first inverter unit 5a, and the second inverter unit 5b have individual separate casings.

In the case where all of the converter units 20 and the first and second inverter units 5a and 5b are included within one and the same casing, it may be possible to omit the serial communication circuit between the computers by causing one microcomputer to perform processing. In the case where only the first and second inverter units 5a and 5b are included within one and the same casing, it may be possible to cause one microcomputer to perform processing of the first and second inverter units 5a and 5b within the same casing.

In the case where a plurality of microcomputers is used for the insulation resistance measurement of the first and second motors 6a and 6b as in the embodiment in FIG. 8, the insulation resistance measurement can be implemented by causing any one of the microcomputers to function as a master in the operation of the insulation resistance measurement of the first and second motors 6a and 6b, and the other microcomputers to function as slaves, and by causing the master microcomputer to give instructions to perform the operation to the slave microcomputers.

In the present embodiment, the case is explained where the microcomputer A (23) of the converter unit 20 is caused to function as a master. The microcomputer A (23) of the converter unit 20 gives instructions to turn off all the IGBTs 51a to 56a and 51b to 56b of the first and second inverter units 5a and 5b to all the first and second inverter units 5a and 5b via serial communication units 241, 242, and 244. The microcomputer B (74a) and the microcomputer C (74b) having received the instructions turn off the IGBTs of the inverters of their own. Next, the microcomputer A (23) turns off the first switch.

Next, the microcomputer A (23) performs the first-time measurement in the state where the second switch 9 is turned off. Specifically, the microcomputer A (23) gives instructions and notifies all the first and second inverter units 5a and 5b of the timing at which the first and second current detection units 7a and 7b should perform measurement via the serial communication circuits 241, 242, and 244. The microcomputer B (74a) and the microcomputer C (74b) of the first and second inverter units 5a and 5b having received the notification acquire the measured values of the first current detection unit 7a and the second current detection unit 7b from the AD converters 73a and 73b, respectively. Further, the microcomputer A (23) itself also acquires the measured value of the voltage detection unit 8 of the converter unit 20 from the AD converter 21 at the same timing as that at which the microcomputers B and C (74a, 74b) of the first and second inverter units 5a and 5b acquire the measured values from the AD converters 73a and 73b. Each of the microcomputers A to C (23, 74a, 74b) is caused to hold and store the measured value acquired from each of the AD converters 21, 73a, and 73b as the result of the first-time measurement.

Next, the microcomputer A (23) performs the second-time measurement in the state where the second switch 9 is turned on. As in the first-time measurement, the microcomputer A (23) gives instructions and notifies all the first and second inverter units 5a and 5b of the timing at which the first and second current detection units 7a and 7b should perform measurement via the serial communication circuits 241, 242, and 244. The microcomputer B (74a) and the microcomputer C (74b) of the first and second inverter units 5a and 5b having received the notification acquire the measured values of the first current detection unit 7a and the second current detection unit 7b from the AD converters 73a and 73b, respectively. Further, the microcomputer A (23) itself also acquires the measured value of the voltage detection unit 8 of the converter unit 20 from the AD converter 21 at the same timing as that at which the microcomputers B and C (74a, 74b) of the first and second inverter units 5a and 5b acquire the measured values from the AD converters 73a and 73b. Each of the microcomputers A to C (23, 74a, 74b) is caused to hold and store the measured value acquired from each of the AD converters 21, 73a, and 73b as the result of the second-time measurement. When the second-time measurement is completed, the microcomputer A (23) returns the second switch 9 to the OFF state.

When the second-time measurement is completed, the microcomputer A (23) transmits the measured values of the first-time measurement and the second-time measurement which have been measured by the voltage detection unit 8 of the converter unit 20 to all the first and second inverters 5a and 5b via the serial communication circuits 241, 242, and 244.

Upon receipt of the measured values of the first-time measurement and the second-time measurement of the voltage detection unit 8 of the converter unit 20 via the serial communication circuits 241, 242, and 244, the microcomputer B (74a) and the microcomputer C (74b) of the first and second inverter units 5a and 5b use the measured values of the first-time measurement and the second-time measurement of the first current detection unit 7a and the second current detection unit 7b held by the microcomputer B (74a) and the microcomputer C (74*b*) themselves and the measured values of the first-time measurement and the second-time measurement of the voltage detection unit 8 of the converter unit 20 which have been received via the serial communication circuits 241, 242, and 244, and the microcomputer B (74*a*) calculates the insulation resistance value Rm1 of the first motor 6*a* by an arithmetic operation and the microcomputer C (74*b*) calculates the insulation resistance value Rm2 of the second motor 6*b* by an arithmetic operation.

The microcomputer B (74*a*) and the microcomputer C (74*b*) notify the higher-level controller 15 of the insulation resistance values of the motors obtained respectively by the arithmetic operation and a measurement completion signal indicating the timing at which the measurement is completed via serial communication circuits 243, 245, and 246. Further, the microcomputer B (74*a*) and the microcomputer C (74*b*) also notify the higher-level controller 15 of the results of the insulation deterioration determination that has determined the degree of insulation deterioration by comparing the obtained insulation resistance values of the motors with a reference value set in advance via the serial communication circuits 243, 245, and 246.

A configuration example of the higher-level controller 15 is as explained in FIG. 10. The higher-level controller 15 records information in which information on the date and time of the reception of the measurement completion signal and the measurement result of the insulation resistance value are made to correspond to each other in a one-to-one manner for each of the first and second motors 6*a* and 6*b* in the ROM 16 as well as displaying the insulation deterioration determination results having been received via the serial communication circuits 243, 245, and 246 on the display unit 13. Further, the higher-level controller 15 displays the results of the insulation resistance measurement and information on the date and time in the past for each motor recorded in the ROM 16.

With regard to the above-described reference value, it is possible to set any value from outside to the microcomputer B (74*a*) and the microcomputer C (74*b*) as a plurality of reference values for each motor. For example, if two reference values, one of which is 20 [MΩ] as a warning level and the other of which is 2 [MΩ] as an alarm level, are set in advance from outside in accordance with a machine, a device, or the like, that is used and the motor drive device is designed so that a warning is given as a notification when the insulation resistance value of the motor which has been obtained as the result of the measurement is equal to or less than 20 [MΩ], and an alarm is given as a notification when it is equal to or less than 2 [MΩ], it is possible for an operator of the machine etc. to determine the degree of insulation deterioration of the motor from the contents of the notification even if he/she has no expertise to determine the degree of insulation deterioration.

Further, in the case where it is desired to set different warning levels and different alarm levels for different motors, reference values may be set for each motor.

The arithmetic operation unit and the determination unit may be provided in each of the microcomputers B and C (74*a*, 74*b*) of the first and second inverters units 5*a* and 5*b* for each motor as in FIG. 8 or arithmetic operations and determinations of a plurality of motors may be performed by one arithmetic unit and one determination unit.

The motor drive device is designed so that the instructions to turn off all the IGBTs 51*a* to 56*a* and 51*b* to 56*b* of the first and second inverter units 5*a* and 5*b* before measurement, which the microcomputer A (23) of the converter unit 20 transmits to all the first and second inverter units 5*a* and 5*b* via the serial communication circuits 241, 242, and 244, the instructions to indicate the timing at which the first and second inverter units 5*a* and 5*b* are caused to perform the current measurement in the second-time measurement, and the voltage measured values of the converter unit 20 which are sent to the first and second inverter units 5*a* and 5*b* after the second-time measurement is completed may be received in common by all the first and second inverter units 5*a* and 5*b*. Further, the motor drive device is designed so that upon receipt of instructions or data in common to all the first and second inverter units 5*a* and 5*b* from the converter side 20 via the serial communication circuits 241, 242, and 244, all the first and second inverter units 5*a* and 5*b* perform the determined operation described previously at the determined timing.

In particular, in the case of the motor drive device in which a plurality of inverter units (5*a*, 5*b*, . . . ) and the converter unit 20 are included in separate casings, there can be considered a variety of combinations of the number of inverter units (5*a*, 5*b*, . . . ) connected to one converter unit 20 and the number of motors (6*a*, 6*b*, . . . ) connected via the inverter unit. However, by making use of the above-described mechanism, it is made possible to measure the insulation resistances of all the motors connected to the same converter unit via a plurality of inverter units and to detect insulation deterioration without the need to perform special settings or to change connections for any combination of the number of inverter units connected to the converter unit 20 and the number of motors.

According to the present invention, it is possible to detect the state of deterioration of the insulation resistor of a motor with a high accuracy compared to the conventional technique.

What is claimed is:

1. A motor drive device, comprising:
a first switch;
a rectification circuit configured to rectify an alternating-current voltage supplied from an alternating-current power source via the first switch into a direct-current voltage;
a power source unit comprising a capacitor and configured to smooth the direct-current voltage rectified by the rectification circuit by the capacitor;
an inverter unit comprising a semiconductor switching element and configured to drive a motor by converting the direct-current voltage smoothed by the power source unit into an alternating-current voltage by a switching operation of the semiconductor switching element;
a resistor, one end of which is connected to a coil of the motor and the other end of which is connected to a first terminal of the capacitor;
a current detection unit configured to measure a current value of a current flowing through the resistor;
a voltage detection unit configured to measure a voltage value of a voltage across the first terminal and a second terminal of the capacitor;
a second switch that grounds the second terminal of the capacitor; and
an insulation resistance detection unit configured to stop the operation of the motor, turn off the first switch, and detect an insulation resistance value of an insulation resistance of the motor, by using two sets of the current value and the voltage value measured in a state where the second switch is turned off and in a state where the second switch is turned on, wherein an influence of a leakage current of the semiconductor switching element is eliminated by using the two sets of the current value and the voltage value measured in the state where the second switch is turned off and in the state where the second switch is turned on, and wherein the insulation resistance is a resistance between the coil of the motor and the ground.

2. The motor drive device according to claim 1, further comprising:
   a memory storing a reference value of the insulation resistance of the motor;
   an arithmetic operation unit configured to compare the insulation resistance value detected by the insulation resistance detection unit and the reference value set in advance; and
   a display unit configured to display a result of the comparison made by the arithmetic operation unit.

3. The motor drive device according to claim 1, wherein each time the insulation resistance is measured, the insulation resistance value detected by the insulation resistance detection unit is recorded together with information on the date and time of the measurement of the insulation resistance.

4. An insulation resistance detection method of a motor, the method comprising:
   rectifying, by a rectification circuit, an alternating-current voltage supplied from an alternating-current power source via a first switch into a direct-current voltage;
   smoothing, by a capacitor of a power source unit, the direct-current voltage rectified by the rectification circuit;
   driving, by an inverter unit, a motor by converting the direct-current voltage smoothed by the power source unit into an alternating-current voltage by a switching operation of a semiconductor switching element of the inverter unit;
   measuring, by a current detection unit, a current value of a current flowing through a resistor one end of which is connected to a coil of the motor and the other end of which is connected to a first terminal of the capacitor;
   measuring, by a voltage detection unit, a voltage value of a voltage across the first terminal and a second terminal of the capacitor;
   stopping the operation of the motor and turning off the first switch;
   turning off a second switch, which grounds the second terminal of the capacitor, and measuring the current value and the voltage value to obtain a first set of the current value and the voltage value;
   turning on the second switch and measuring the current value and the voltage value to obtain a second set of the current value and the voltage value; and
   detecting an insulation resistance value of an insulation resistance of the motor, by using the first and second sets of the current value and the voltage value measured when the second switch is turned off and when the second switch is turned on, wherein an influence of a leakage current of the semiconductor switching element is eliminated by using the two sets of the current value and the voltage value measured in the state where the second switch is turned off and in the state where the second switch is turned on, and wherein the insulation resistance is a resistance between the coil of the motor and the ground.

* * * * *